(12) United States Patent
Yang et al.

(10) Patent No.: US 11,101,128 B1
(45) Date of Patent: Aug. 24, 2021

(54) METHODS FOR GAPFILL IN SUBSTRATES

(71) Applicant: Applied Materials, Inc., Santa Clara, CA (US)

(72) Inventors: Yixiong Yang, San Jose, CA (US); Wei Liu, San Jose, CA (US); Yuan-hui Lo, San Jose, CA (US); Srinivas Gandikota, Santa Clara, CA (US); Jacqueline Samantha Wrench, Santa Clara, CA (US); Yongjing Lin, San Jose, CA (US); Wen Ting Chen, San Jose, CA (US); ShihChung Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/817,378

(22) Filed: Mar. 12, 2020

(51) Int. Cl.
*H01L 21/02* (2006.01)

(52) U.S. Cl.
CPC .............. *H01L 21/02244* (2013.01); *H01L 21/02249* (2013.01)

(58) Field of Classification Search
CPC ............... H01L 21/02249; H01L 21/02244
See application file for complete search history.

(56) References Cited

U.S. PATENT DOCUMENTS

| | | | | |
|---|---|---|---|---|
| 5,726,094 A * | 3/1998 | Schwalke | ............. | H01L 21/762 257/E21.545 |
| 5,805,973 A * | 9/1998 | Coffinberry | ............ | C23C 16/403 428/551 |
| 6,077,643 A * | 6/2000 | Kumar | .................... | G03F 7/039 430/270.1 |
| 6,149,974 A * | 11/2000 | Nguyen | ............. | C23C 16/0272 427/255.29 |
| 6,149,987 A * | 11/2000 | Perng | ................ | H01L 21/31695 427/579 |
| 6,200,893 B1 * | 3/2001 | Sneh | .................. | H01L 21/31691 438/685 |
| 6,759,081 B2 * | 7/2004 | Huganen | .............. | G11B 5/3109 29/603.07 |

(Continued)

FOREIGN PATENT DOCUMENTS

KR      1020040001912 A      1/2004

OTHER PUBLICATIONS

International Search Report/ Written Opinion issued to PCT/US2021/018651 dated Jun. 10, 2021.

*Primary Examiner* — Seahvosh Nikmanesh
(74) *Attorney, Agent, or Firm* — Patterson + Sheridan, LLP

(57) ABSTRACT

The present disclosure provides methods for treating film layers in a substrate including positioning the substrate in a processing volume of a processing chamber. The substrate can have high aspect ratio features extending a depth from a substrate surface to a bottom surface. The feature can have a width defined by a first sidewall and a second sidewall. A film with a composition that includes metal is formed on the substrate surface and the first sidewall, the second sidewall, and the bottom surface of each feature. The film in the feature can have a seam extending substantially parallel to the first and second sidewalls. The film is annealed and exposed to an oxygen radical while converting the metal of the film to a metal oxide. The metal oxide is exposed to a hydrogen radical while converting the metal oxide to a metal fill layer.

20 Claims, 4 Drawing Sheets

(56) References Cited

U.S. PATENT DOCUMENTS

| | | | |
|---|---|---|---|
| 6,849,471 B2* | 2/2005 | Patel | B81C 1/00793 |
| | | | 257/536 |
| 6,867,152 B1* | 3/2005 | Hausmann | C23C 16/401 |
| | | | 438/778 |
| 7,208,354 B2* | 4/2007 | Bauer | H01L 21/02381 |
| | | | 438/151 |
| 7,335,609 B2* | 2/2008 | Ingle | H01L 21/31625 |
| | | | 438/787 |
| 7,541,297 B2* | 6/2009 | Mallick | C23C 16/045 |
| | | | 257/E21.279 |
| 7,544,576 B2* | 6/2009 | Jawarani | H01L 29/1083 |
| | | | 257/E21.211 |
| 7,625,820 B1* | 12/2009 | Papasouliotis | C23C 14/046 |
| | | | 257/E21.553 |
| 7,630,114 B2* | 12/2009 | Wang | B81B 3/0072 |
| | | | 359/237 |
| 7,910,491 B2* | 3/2011 | Soo Kwon | H01L 21/318 |
| | | | 438/738 |
| 8,129,290 B2* | 3/2012 | Balseanu | H01L 21/3185 |
| | | | 438/791 |
| 8,338,225 B2* | 12/2012 | Breitwisch | H01L 45/1233 |
| | | | 438/102 |
| 8,557,712 B1* | 10/2013 | Antonelli | H01L 21/02164 |
| | | | 438/761 |
| 10,192,775 B2 | 1/2019 | Manna et al. | |
| 2010/0203725 A1 | 8/2010 | Choi et al. | |
| 2015/0170961 A1* | 6/2015 | Romero | H01L 21/76816 |
| | | | 438/641 |
| 2015/0243545 A1* | 8/2015 | Tang | C23C 16/45527 |
| | | | 438/430 |
| 2015/0299848 A1* | 10/2015 | Haukka | C23C 16/18 |
| | | | 427/123 |
| 2016/0056077 A1* | 2/2016 | Lai | H01L 21/02247 |
| | | | 438/653 |
| 2016/0093528 A1* | 3/2016 | Chandrashekar | H01L 21/76861 |
| | | | 438/666 |
| 2016/0148800 A1* | 5/2016 | Henri | C23C 16/045 |
| | | | 438/485 |
| 2016/0222504 A1* | 8/2016 | Haukka | C23C 16/0272 |
| 2018/0358264 A1 | 12/2018 | Wu et al. | |

* cited by examiner

200

202 — POSITION THE SUBSTRATE IN A PROCESSING CHAMBER COMPRISING A PROCESSING VOLUME, THE SUBSTRATE HAVING AT LEAST ONE FEATURE EXTENDING A DEPTH FROM A SUBSTRATE SURFACE TO A BOTTOM SURFACE, THE AT LEAST ONE FEATURE HAVING A WIDTH DEFINED BY A FIRST SIDEWALL AND A SECOND SIDEWALL

204 — FORM A FILM COMPRISING A METAL ON THE SUBSTRATE SURFACE AND THE FIRST SIDEWALL, THE SECOND SIDEWALL, AND THE BOTTOM SURFACE OF THE AT LEAST ONE FEATURE, THE FILM HAVING A SEAM EXTENDING SUBSTANTIALLY PARALLEL TO THE FIRST AND SECOND SIDEWALLS, THE SEAM HAVING A SEAM WIDTH

206 — EXPOSE THE FILM WITHIN THE SEAM TO AN OXYGEN RADICAL WHILE CONVERTING THE METAL OF THE FILM TO A METAL OXIDE, WHEREIN THE SEAM IS AT LEAST PARTIALLY FILLED WITH THE METAL OXIDE

208 — EXPOSE THE METAL OXIDE TO A HYDROGEN RADICAL WHILE CONVERTING THE METAL OXIDE TO A METAL FILL LAYER

210 — EXPOSE THE METAL FILL LAYER TO A NITROGEN RADICAL WHILE CONVERTING THE METAL FILL LAYER TO A METAL NITRIDE LAYER, WHEREIN THE METAL NITRIDE LAYER IS SUBSTANTIALLY SEAMLESS

FIG. 2

METHODS FOR GAPFILL IN SUBSTRATES

BACKGROUND

Field

Embodiments of the present disclosure generally relate to systems and methods of manufacturing a semiconductor device. More particularly, the present disclosure is directed to systems and methods of treating a substrate.

Description of the Related Art

In microelectronics device fabrication there is a need to fill narrow trenches free of voids for many applications. One application is for shallow trench isolation (STI). For this application, the film needs to be of high quality throughout the trench with very low leakage. Chemical vapor deposition (CVD) and atomic layer deposition (ALD) are techniques used to deposit film into the trenches. The as-deposited film is followed by processing operations such as steam anneals and UV-cures to improve film quality.

As the dimensions of the structures decrease and the aspect ratios increase post curing methods of the as deposited flowable films become difficult, resulting in films with varying composition throughout the filled trench. In 3-dimensional structures, a seam is often observed in the filled trench after the film is deposited. For example, conventional plasma-enhanced processes for depositing film often form a "mushroom shaped" film on top of the narrow trenches which is caused by the inability of the plasma to penetrate into the deep trenches. This results in pinching off the narrow trench from the top and forming a void or seam in the trench. This seam can be opened up or exposed post process and can cause structure failure.

Therefore, there is a need for methods for gapfill in high aspect ratio structures that can provide seam-free film growth.

SUMMARY

In some embodiments, a method is provided for treating film layers in a substrate including positioning the substrate in a processing volume of a processing chamber. The substrate having at least one feature extending a depth from a substrate surface to a bottom surface. The feature has a width defined by a first sidewall and a second sidewall. A film with a composition that includes metal is formed on the substrate surface and the first sidewall, the second sidewall, and the bottom surface of each feature. The film in the feature has a seam extending substantially parallel to the first and second sidewalls. The film is heated at a temperature of about 300° C. to about 1000° C. The film within the seam is exposed to an oxygen radical while converting the metal of the film to a metal oxide. The seam is at least partially filled with the metal oxide or can be completely filled with the metal oxide. The method includes exposing the metal oxide to a hydrogen radical while converting the metal oxide to a metal fill layer.

In some embodiments, a method is provided for treating film layers in a substrate including positioning the substrate in a processing volume of a processing chamber. The substrate includes at least one feature extending a depth from a substrate surface to a bottom surface. The feature has a width defined by a first sidewall and a second sidewall, and a film composed of a metallic material or a metal nitride material disposed along the first sidewall, the second sidewall, and the bottom surface of the at least one feature. The film having a seam extending between at least a portion of the film formed on the first sidewall and at least a portion of the film formed on the second sidewall. The film within the seam is exposed to an oxygen radical while converting the metallic material to a metal oxide or converting the metal nitride material to a metal oxynitride material. The seam is at least partially filled with the metal oxide or the metal oxynitride material. The metal oxide or the metal oxynitride material can be exposed to a hydrogen radical while converting the metal oxide to a metal fill layer or converting the metal oxynitride material to a metal nitride fill layer.

In some embodiments, a method is provided for treating film layers in a substrate including positioning the substrate in a first processing volume of a first processing chamber. The substrate includes at least one feature extending a depth from a substrate surface to a bottom surface. The feature has a width defined by a first sidewall and a second sidewall. A film with a composition that includes metal is formed on the substrate surface and the first sidewall, the second sidewall, and the bottom surface of each feature. The film in the feature has a seam extending substantially parallel to the first and second sidewalls. The substrate is positioned in a second processing chamber having a second processing volume and heated at a temperature of about 400° C. to about 650° C. The film within the seam is exposed to an oxygen radical while converting the metal of the film to a metal oxide. The seam is at least partially filled with the metal oxide or can be completely filled with the metal oxide. The method includes exposing the metal oxide to a hydrogen radical while converting the metal oxide to a metal fill layer. The metal fill layer is exposed to a nitrogen radical to convert the metal fill layer to a metal nitride fill layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings.

FIG. 2 depicts a flow diagram of an example method for treating a substrate in accordance with embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Before describing embodiments of the present disclosure, it is to be understood that the present disclosure is not limited to the details of construction or methods set forth in the following description. The present disclosure is capable of other embodiments and of being practiced or being carried in various ways.

A "substrate" as used herein, refers to any substrate or material surface formed on a substrate upon which film processing is performed during a fabrication process. For example, a substrate surface on which processing is to be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates are exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing operations disclosed can be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Certain aspects of the present disclosure provide systems and methods for treating substrates with high aspect ratio features. Some embodiments provide methods to provide seam-free metal, metal nitride, or metal alloy films to fill high aspect ratio trenches. For example, high aspect ratio features that are to be treated include trenches within 3D structures such as memory and logic devices, such as metal gate layers of logic devices, such as fin field-effect transistors ("FinFET"), gate-all-around field-effect transistors ("GAA FET"), dynamic random-access memory ("DRAM"), and vertical NAND ("V-NAND") structures.

Figure 1A:
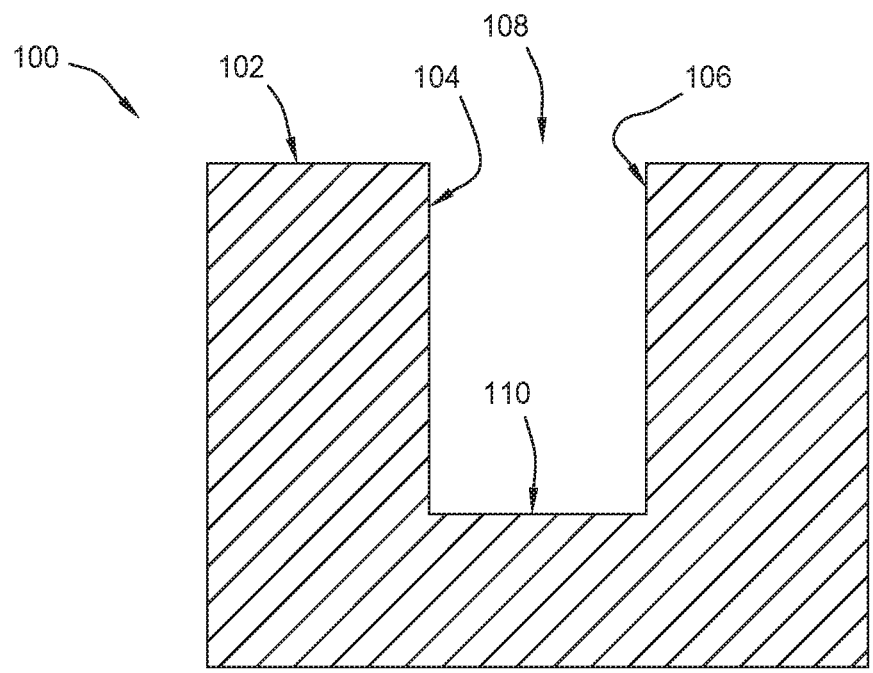
FIG. 1A depicts a cross-sectional schematic of a substrate feature before depositing a film layer in accordance with embodiments of the present disclosure.
Figure 1B:
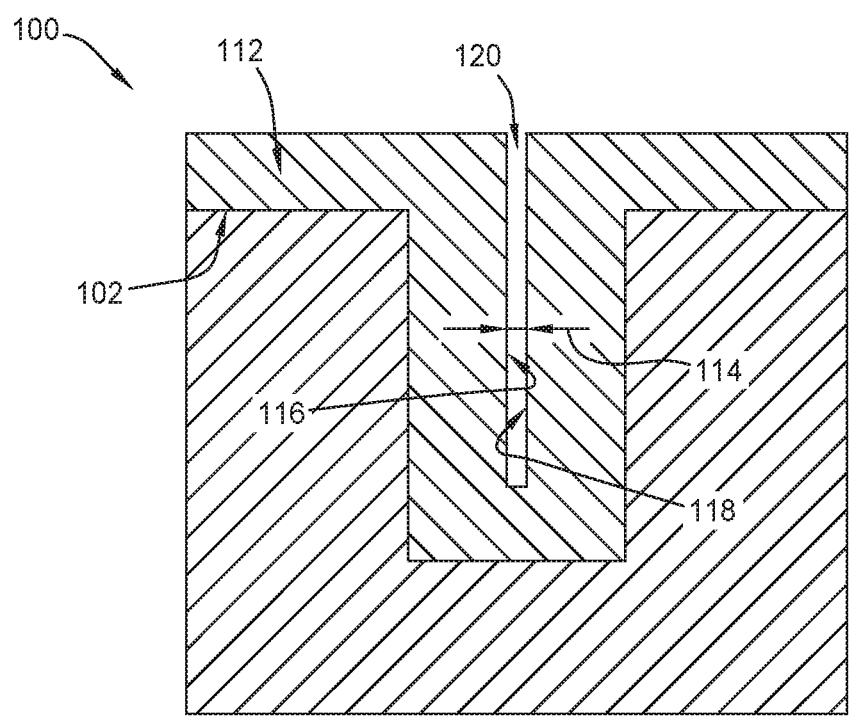
FIG. 1B depicts a cross-sectional schematic of a substrate feature after depositing a film layer in accordance with embodiments of the present disclosure.

FIG. 1A and FIG. 1B depict cross-sectional schematics of a substrate 100 with a feature 108. The figures show substrates having a single feature for illustrative purposes; however, those skilled in the art will understand that there can be more than one feature. The shape of the feature 108 can be any suitable shape including, but not limited to, trenches and cylindrical vias. As used herein, the term "feature" means any intentional surface irregularity. Suitable examples of features include, but are not limited to trenches with have a top, two sidewalls and a bottom, and fins which have a top and two walls. Features can have any suitable aspect ratio (ratio of the depth of the feature to the width of the feature). In some embodiments, the aspect ratio is at least about 5:1, such as from about 5:1 to about 50:1, alternatively at least about 10:1, such as at least about 20:1.

FIG. 2 depicts a flow diagram of an example method for treating a metal film layer in accordance with embodiments of the present disclosure. With reference to FIGS. 2 and 1A and 1B, the substrate 100 is positioned for processing in a first processing volume of a first processing chamber at operation 202. The substrate 100 has at least one feature 108 extending a depth from the substrate surface 102 to a bottom surface 110, the at least one feature 108 having a width defined by the distance between a first sidewall 104 and a second sidewall 106, as shown in FIG. 1A.

At operation 204, a film 112 is formed on the substrate 100, as depicted in FIG. 1B. The film can be any suitable film composed of at least one metal. The metal can be selected from tantalum (Ta), titanium (Ti), tungsten (W), chromium (Cr), cobalt (Co), aluminum (Al), copper (Cu), molybdenur (Mo), rubidium (Rb), tantalum nitride (TaN), titanium nitride (TiN), tungsten nitride (WN), chromium nitride (CrN), aluminum nitride (AlN), rubidium nitride (RbN), alloys thereof, or combinations thereof. In some embodiments which can be combined with other embodiments, the film can be a metal nitride such as TaN, TiN, WN, CrN, AlN, RbN, alloys thereof, or combinations thereof. In some embodiments, which can be combined with other embodiments, the film can be a metal Ta, Ti, W, Cr, Co, Al, Cu, Mo, Rb, alloys thereof, or combinations thereof.

In some embodiments, which can be combined with other embodiments, the film or coating is formed by chemical vapor deposition (CVD), however, other suitable methods such as plasma-enhanced chemical vapor deposition (PE-CVD), atomic layer deposition (ALD) and plasma-enhanced atomic layer deposition (PE-ALD) are also contemplated. The film is formed conformally on at least one feature. As used herein, the term "conformal," or conformally," refers to a layer that adheres to and uniformly covers exposed surfaces with a thickness having a variation of less than 1% relative to the average thickness of the film. In at least one example, a 1,000 Å thick film has less than 10 Å of variation in thickness, such as about 1 Å to 10 Å. The thickness and variation includes edges, corners, sides, and the bottom of recesses. In some embodiments, which can be combined with other embodiments, the conformal layer is deposited by ALD providing coverage over the deposited regions of essentially uniform thickness on complex surfaces.

In some embodiments, which can be combined with other embodiments, the film 112 is a continuous film. As used herein, the term "continuous" refers to a layer that covers an entire exposed surface without gaps or bare spots that reveal material underlying the deposited layer. A continuous layer has gaps or bare spots with a surface area less than about 1% of the total surface area of the film.

The film 112 is formed on the substrate surface 102, the first sidewall 104 of the feature 108, a second sidewall 106 of the feature 108, and the bottom surface 110 of the feature 108. In some embodiments, which can be combined with other embodiments, the film 112 of the substrate 100 is heated before or while the film is deposited on the substrate. The film is heated at a temperature of at least 300° C., such as 300° C. to about 1000° C., such as about 400° C. to about 650° C., such as about 400° C. to about 500° C., such as about 450° C. The deposition temperature is selected based on the film composition, the deposition method, the pressure of the processing chamber, a temperature necessary to anneal the film, or a combination thereof. Forming the film 112 causes a seam 120 to be formed. The seam 120 extends substantially parallel to the first and second sidewalls 104, 106. The seam 120 has a seam width 114 defined by a distance between a first seam wall 116 and a second seam wall 118. The width of the seam varies along the seam length. The seam width 114 refers to the portion of the seam having the largest width along the length of the seam 120. In some embodiments, the seam width is 2 Å to about 50 Å, such as about 2 Å to about 20 Å, such as from about 3 Å to about 10 Å, as measured by TEM.

Figure 3A:
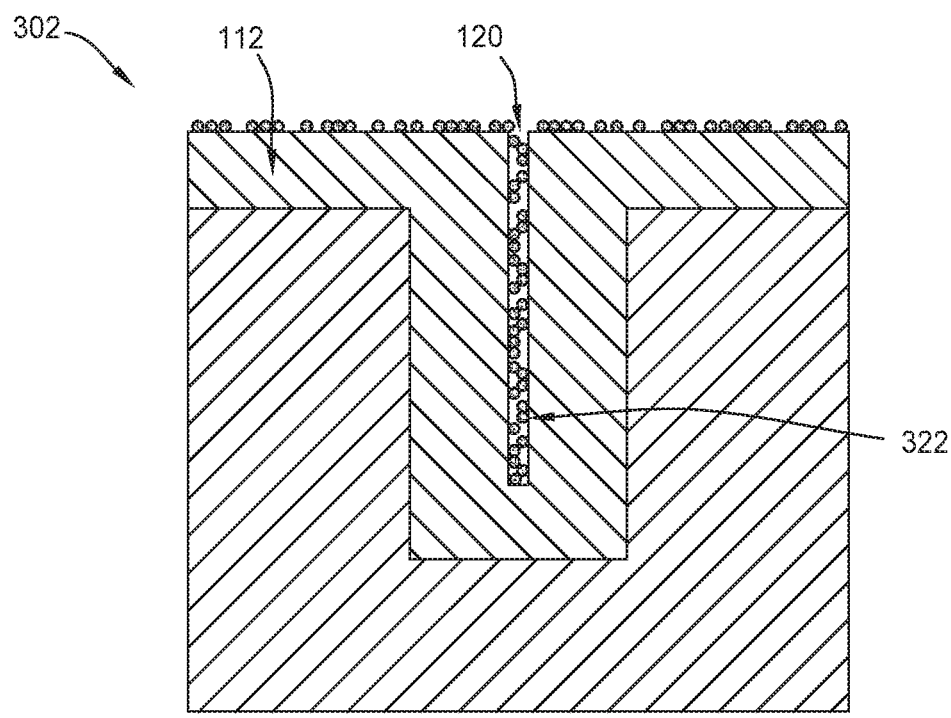
FIG. 3A depicts a cross-sectional schematic of a substrate feature after depositing a film layer and exposing to a first radical species, in accordance with embodiments of the present disclosure.

At operation 206, the film surface including the film inside the seam is exposed to an oxygen radical while converting the metal or metal nitride of at least a portion of the surface of the film to a metal oxide. The portion of the surface of the film that is converted is about 2 Å to about 150 Å, such as about 2 Å to about 100 Å, such as about 5 Å to about 50 Å in thickness inward from each of the seam sidewalls 104, 106. The seam is at least partially filled with the metal oxide or metal oxynitride. Without being bound by theory, it is believed that under annealing conditions, the metal ions or metal nitride ions in the film react with oxygen atoms at the surface to form larger, metal oxide or metal oxynitride molecules at a surface of the film. The larger molecules create stress and oxide displacement at grain boundaries which results in crystal grain growth as adjacent grains can combine while recrystallizing. The enlarged grains can expand the film conformally at the surface of the film including the film within the seam. Thus, the seam is at least partially filled by the expanded film. The substrate 302 having a seam that is at least partially filled with metal oxide or metal oxynitride 322 is depicted in FIG. 3A. In some embodiments, which can be combined with other embodiments, the seam is substantially filled with the metal oxide. The metal oxide is selected from AlO, TiO, TaO, WO, CrO, CoO, CuO, MoO, RbO, alloys thereof, or combinations thereof. In some embodiments, which can be combined with other embodiments, the seam is substantially filled with the metal oxynitride. The metal oxynitride is selected from AlON, TiON, TaON, WON, CrON, CoON, CuON, MoON, RbON, alloys thereof, or combinations thereof. The conditions as described herein, enables partially oxidizing the film to expand just enough to partially fill the seam without over oxidizing the entire film. The consequence of over oxidizing the film can lead to device failure and resistivity outside the range that is targeted for predetermined application. Additionally, the inventors have discovered that over-oxidizing the film can make it more difficult for the hydrogen to reduce the film if is over expanded with large metal oxide or metal oxynitride molecules. In particular, the seam should be large enough to allow hydrogen atoms to penetrate the seam. The width of the seam after oxidizing greater than 1.2 Å, such as about 1.5 Å to about 5 Å, such as 2 Å to about 5 Å.

In some embodiments, which can be combined with other embodiments, operation 206 occurs in the first processing chamber. In some embodiments, which can be combined with other embodiments, operation 206 occurs in a second processing chamber having a second processing volume. The substrate 100 depicted in FIG. 1B having a film 112 thereon is positioned into a second processing chamber having a second processing volume and exposed to an oxygen radical. In some embodiments, the film 112 of the substrate 100 is heated at a temperature of at least 300° C., such as 300° C. to about 1000° C., such as about 400° C. to about 650° C., such as about 400° C. to about 500° C., such as about 450° C. In some embodiments, the second processing volume is maintained at below atmospheric pressure. The pressure at operation 206 is maintained at about 0.2 torr to about 5 torr, such as about 0.3 torr to about 5 torr, such as about 0.5 torr to about 5 torr, such as about 2 torr to about 4 torr, such as about 3 torr. In at least one embodiment, the pressure in the second processing volume is about 0.2 torr to about 5 torr, such as about 0.3 torr to about 5 torr, such as about 0.5 torr to about 5 torr, such as about 2 torr to about 4 torr, such as about 3 torr. In some embodiments, which can be combined with other embodiments, the oxygen radical is formed in a plasma source. The plasma source is selected from a remote plasma source, an inductively coupled plasma source, and a microwave plasma source. In some embodiments, the plasma source includes an excitation source such as a radio frequency (RF). At operation 206, the RF power for plasma generation is about 2 kW to about 10 kW, such as about 7 kW to about 9 kW, such as about 8 kW. The oxygen radical is formed outside of the processing volume and flowed into the processing volume, or the oxygen radical is formed inside the processing volume.

For radicals formed inside the processing volume, it has been found that operating a pressure that is too low increases ion sputtering that causes surface deformation, or facetting of film edges and/or corners. For radicals formed remotely from the processing volume, ion sputtering is not a concern because these processes include ion filters that screen ions before entering the processing volume. However, for radicals formed both inside or outside the processing volume, it has been found that radical density is limited at low pressures which limits the reactants used to heal the film seam. Operating at pressures that are too high affects the ability for plasma to sustain itself in the chamber. Thus, the operating pressure of about 0.3 torr to about 5 torr is used within the chamber.

The oxygen radical is formed from oxygen-containing gas, such as oxygen ($O_2$ gas). The film is exposed to the oxygen radical for about 100 seconds to about 600 seconds, such as from about 200 seconds to about 400 seconds, such as about 300 seconds. In some embodiments, which can be combined with other embodiments, the oxygen radical is introduced to the processing chamber with a first gas. The first gas is selected from $H_2$, Ar, Kr, Xe, $N_2$, He, Ne, and combinations thereof. In some embodiments, the oxygen radical is introduced to the processing volume at a flow rate of about 0.1 standard liters per minute (slm) to about 10 slm, such as from about 1 slm to about 6 slm, such as about 2 slm to about 4 slm, such as about 3 slm, or about 4 slm, or about 5 slm. The oxygen radical is introduced to the processing volume with a first gas, the first gas can include argon and hydrogen gas. In some embodiments, which can be combined with other embodiments, oxygen-containing gas can be introduced into the processing volume and the oxygen-containing molecules can be dissociated to oxygen radicals by energizing the oxygen-containing molecules with an RF source. In some embodiments, the components of the first gas, such as argon and/or hydrogen, can promote the dissociation of oxygen molecules to oxygen radicals. In at least one example, the oxygen radical flowing into the processing chamber is about 40% to about 100% by volume of the total gas flowing into the processing volume. In some embodiments, in operation 206, the argon gas can flow into the processing volume at a rate of about 0.1 slm about 10 slm, such as from about 1 slm to about 6 slm, such as about 2 slm to about 4 slm, such as about 3 slm, or about 4 slm, or about 5 slm. In at least one example, in operation 206, the argon gas flowing into the processing chamber is about 0% to about 50% by volume of the total gas flowing into the processing volume in operation 206. In some embodiments, which can be combined with other embodiments, in operation 206, the hydrogen gas can flow into the processing volume at a rate of about 0.1 slm about 5 slm, such as about 0.1 slm to about 1 slm, such as about 0.2 slm to about 0.5 slm, such as about 0.3 slm, or about 0.4 slm, or about 0.5 slm. In at least one example, the hydrogen gas flowing into the processing chamber is about 0% to about 50% by volume of the total gas flowing into the processing volume in operation 206.

Without being bound by theory, it is believed that exposing the film to oxygen radical in the presence of heat enables "healing" and reduction of the seam width by enabling grain crystal/growth of the film. By way of illustration, a titanium nitride (TiN) film is exposed to oxygen radical and an oxygen dopant is introduced into the film. Because the TiO is larger than TiN, an expansion in the film volume is observed and consequently, a reduction in the seam width can also be observed. It has been found that increasing temperature of the film without the presence of oxygen does not reduce the size of the seam in the film. It is observed that exposing the film to oxygen radical under conditions described herein can oxidize the film and result in a composition including a combination of molecules formed form titanium, oxygen, and nitrogen atoms. Because titanium oxide can adversely affect resistivity in some applications, the inventors have discovered that the oxide is stripped or reduced from the film using a hydrogen radical treatment. The reduction leaves behind the Ti atoms in the lattice framework. The metal oxide or metal oxynitride layer can have about 2 wt % to about 60 wt % oxygen atoms prior to the reduction reaction and about 5 wt % to about 50 wt % of oxygen atoms after the reduction reaction. The reduction reaction is described at operation 208 below. Moreover, in some applications, nitrogen is added back to the framework as described below in reference to operation 210 in order to maintain the TiN chemical composition and properties. Devices that use metal films, such as Ti films, are treated as described in operations 206 and 208. Devices that use metal nitride films, such as TiN films, are treated as described in operations 206, 208, and 210 described below.

Figure 3B:
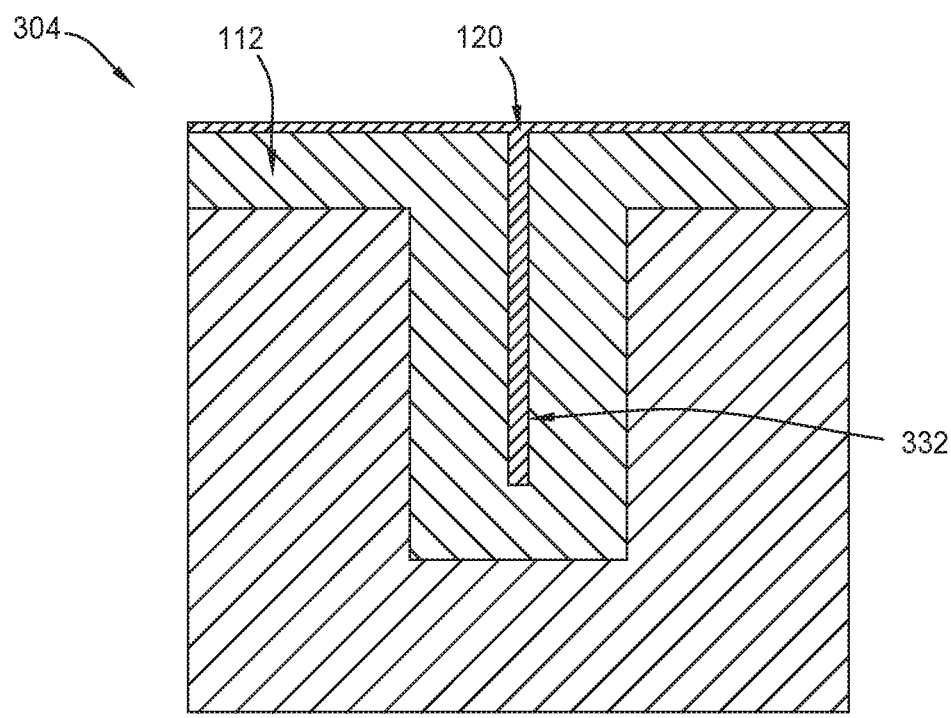
FIG. 3B depicts a cross-sectional schematic of a substrate feature after depositing a film layer and exposing to a second radical species, in accordance with embodiments of the present disclosure.

At operation 208, the metal oxide or metal oxynitride is exposed to a hydrogen radical while converting the metal oxide or metal oxynitride to a metal fill layer 332, resulting in the seam at least partially filled with the metal fill layer 332. The substrate 304 having a seam that is substantially filled with metal film layer 332 is depicted in FIG. 3B. For devices that use metal films, such as Ti films, the seam is substantially filled with the metal fill layer 332. In some embodiments, which can be combined with other embodiments, the metal fill layer 332 of the film, such as metal film is substantially free of a seam. In some embodiments, which can be combined with other embodiments, the metal fill layer 332 of the film can have a seam that has a width that is less than about half, or less than about a quarter, or less than about 10% of the width to the seam width 114 before exposing the film. In one example, the seam width of the metal fill layer 332 of the film is less than about 1 Å. In particular, no seam is observed under transmission electron microscopy ("TEM") imaging. For metal nitride films, the seam after exposure to hydrogen radical is greater than the atomic diameter of nitrogen to allow for penetration of nitrogen atoms into the seam. In particular, for metal nitride films, the width of the seam after reducing is greater than 1.6 Å, such as about 1.6 Å to about 5 Å, such as 2 Å to about 5 Å.

Operation 208 occurs in the same processing chamber as operation 206, such as in the first process chamber or the second processing chamber. However, it is contemplated that in some embodiments, operation 208 can occur in a different processing chamber as operation 206. The temperature is maintained at a temperature of at least 300° C., such as about 300° C. to about 1000° C., such as about 400° C. to about 650° C., such as about 400° C. to about 500° C., such as about 450° C. The second processing volume is maintained at below atmospheric pressure during processing. The pressure at operation 208 is maintained at about 0.2 torr to about 5 torr, such as about 0.3 torr to about 5 torr, such as about 0.5 torr to about 5 torr, such as about 2 torr to about 4 torr, such as about 3 torr, such as about 1 torr, or about 2 torr.

The hydrogen radical of operation 208 is formed outside of the processing volume and flowed into the processing volume, or the hydrogen radical is formed inside the processing volume. For hydrogen radical formed outside of the processing volume, the hydrogen radical is formed in a plasma source. The plasma source is selected from a remote plasma source, which may be either an inductively coupled plasma source or a microwave plasma source. The plasma source includes an excitation source such as a radio frequency (RF) source. At operation 208, the RF power applied by the RF source is about 2 kW to about 10 kW, such as about 7 kW to about 9 kW, such as about 8 kW. The hydrogen radical is formed from hydrogen gas. The film is exposed to the hydrogen radical for about 100 seconds to about 600 seconds, such as from about 100 seconds to about 300 seconds, such as about 150 seconds.

In some embodiments, which can be combined with other embodiments, the hydrogen radical is introduced to the processing chamber with a second gas. The second gas is selected from argon (Ar), krypton (Kr), xenon (Xe), nitrogen (N), helium (He), neon (Ne), or any combination thereof. The hydrogen radical is introduced to the processing volume at a flow rate of about 0.1 slm to about 10 slm, such as from about 0.1 slm to about 5 slm, such as about 0.1 slm to about 1 slm, such as about 0.3 slm to about 0.4 slm, such as about 0.35 slm.

While aspects above describe formation of hydrogen radicals using a remote plasma source, it is contemplated that hydrogen radicals may be generated in situ (e.g., in the processing chamber). In such an example, hydrogen gas is introduced into the processing volume and the hydrogen (H2) molecule is dissociated to hydrogen radicals by energizing the hydrogen molecules with an RF source. The components of the second gas, such as argon gas, promote the dissociation of hydrogen to hydrogen radicals. In at least one example, the hydrogen radical flowing into the processing chamber is about 2% to about 100% by volume of the total gas flowing into the processing volume. In operation 208, the argon gas can flow into the processing volume at a rate of about 0.1 slm about 10 slm, such as from about 1 slm to about 6 slm, such as about 2 slm to about 4 slm, such as about 3 slm, or about 3.15 slm, or about 4 slm. In at least one example, in operation 208, the argon gas flowing into the processing chamber is about 0% to about 98% by volume of the total gas flowing into the processing volume in operation 208.

At optional operation 210, the metal fill layer 332 is exposed to a nitrogen radical while converting the metal fill layer 332 to a metal nitride layer 342, resulting in the seam substantially filled with the metal nitride layer 342.

Figure 3C:
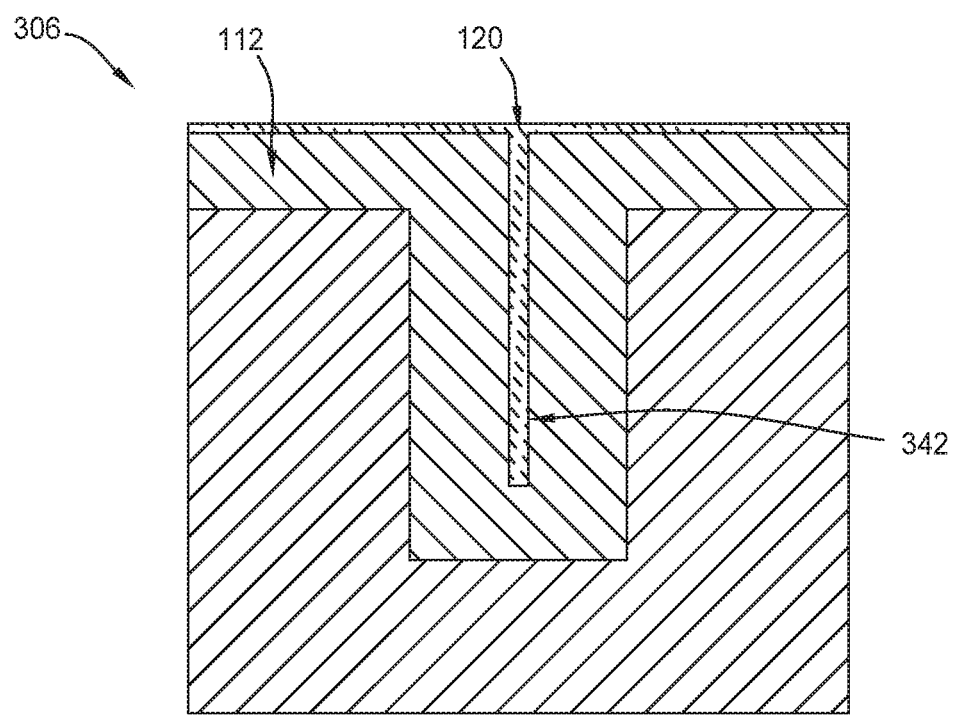
FIG. 3C depicts a cross-sectional schematic of a substrate feature after depositing a film layer and after performing the method of the present disclosure, in accordance with embodiments of the present disclosure.

The substrate 304 having a metal nitride layer 342 is depicted in FIG. 3C. The metal nitride layer 342 of the film is substantially free of seams. In some embodiments which can be combined with other embodiments, the metal nitride layer 342 of the film can have a seam that with a width is less than about half, or less than about a quarter, or less than about 10% of the width to the seam width 114 before exposing the film in operations 206 to 210. The seam width of the metal nitride layer 342 of the film is less than about 1 Å. In particular, no seam is observed under transmission electron microscopy ("TEM") imaging.

Operation 210 occurs in the same processing chamber as operations 206 and/or 208, such as in the first process chamber or the second processing chamber. However, it is contemplated that operation 210 can occur in a different processing chamber as operation 206 and/or 208. During operation 210, the temperature is maintained at a temperature of at least 300° C., such as 300° C. to about 1000° C., such as about 400° C. to about 650° C., such as about 400° C. to about 500° C., such as about 450° C. The pressure at operation 210 is maintained at about 0.2 torr to about 5 torr, such as about 0.3 torr to about 5 torr, such as about 0.5 torr to about 5 torr, such as about 2 torr to about 4 torr, such as about 3 torr, such as about 1 torr, or about 2 torr.

The nitrogen radical of operation 210 is formed in a plasma source, such as a remote plasma source, including an inductively coupled plasma source or a microwave plasma source. The plasma source includes an excitation source, such as a radio frequency (RF), to facilitate radical generation. At operation 210, the RF power provided by the RF source is about 6 kW to about 10 kW, such as about 7 kW to about 9 kW, such as about 8 kW. The nitrogen radical is formed outside of the processing volume and flowed into the processing volume. The nitrogen radical is formed from nitrogen containing gas, such as nitrogen gas and/or ammonia gas and/or N2H4. The film is exposed to the nitrogen radical for about 100 seconds to about 600 seconds, such as from about 100 seconds to about 300 seconds, such as about 150 seconds.

In some embodiments which can be combined with other embodiments, the nitrogen radical is introduced to the processing chamber with a third gas. The third gas is selected from an argon containing gas, a nitrogen containing gas, and combinations thereof, such as ammonia gas, such nitrogen gas.

While aspects above generate radicals in a remote plasma source, it is also contemplated that nitrogen radicals may be generated in situ. Moreover, it is also contemplated that imidogen (e.g., NH radicals) may be generated. In such an example, the nitrogen containing gas can be introduced into the processing volume and the nitrogen containing molecule (e.g., N2, NH3) can be dissociated to nitrogen radicals within the processing volume by energizing the nitrogen containing molecules with an RF source. The components of the third gas, such as an argon gas, a nitrogen containing gas, promotes the dissociation of nitrogen to nitrogen radicals.

The nitrogen radical is introduced to the processing volume at a flow rate of about 0.1 slm to about 10 slm, such as from about 0.1 slm to about 5 slm, such as about 0.1 slm to about 1 slm, such as about 0.3 slm to about 0.6 slm, such as about 0.5 slm. The nitrogen radical is introduced to the processing volume with a third gas, such as argon gas. The argon gas can flow into the processing volume at a rate of about 0.1 slm about 10 slm, such as from about 1 slm to about 6 slm, such as about 2 slm to about 4 slm, such as about 3 slm, or about 4 slm. In at least one example, the nitrogen radical flowing into the processing chamber is about 5% to about 100% by volume of the total gas flowing into the processing volume. In another example, the argon gas flowing into the processing chamber is about 0% to about 95% by volume of the total gas flowing into the processing volume in operation 210.

In some embodiments, which can be combined with other embodiments, the third gas can include an ammonia gas. The ammonia gas can flow into the processing volume at a rate of about 0.1 slm about 10 slm, such as from about 0.1 slm to about 0.6 slm, such as about 0.2 slm to about 0.4 slm, such as about 0.2 slm, or about 0.3 slm. In at least one example, in operation 210, the ammonia gas flowing into the processing chamber is about 0% to about 95% by volume of the total gas flowing into the processing volume in operation 210.

In some embodiments, which can be combined with other embodiments, depositing the film (e.g., operation 204), heating the film, and exposing the film to the radical species (e.g., operation 206, 208, and/or 210) is done in a single chamber. In some embodiments, which can be combined with other embodiments, exposing the film to each radical species is sequential, such that each of the radical species is alternated and pulsed into the processing volume. Alternatively, in other embodiments, exposing the film to each radical species is done simultaneously, such that each of the radical species is continuously flowed into the processing volume.

During processing, a heater or a cooler disposed in a substrate support may control the substrate temperature conductively. The substrate can also be heated convectively by a heat or cooler positioned proximate to the substrate. The gases employed in the present disclosure is also be heated or cooled to locally change the substrate temperature.

Certain features, structures, compositions, materials, or characteristics described herein is combined in any suitable manner in one or more embodiments. Although the present disclosure herein has been described with reference to particular embodiments, it is to be understood that these embodiments are merely illustrative of the principles and applications of the present disclosure. It will be apparent to those skilled in the art that various modifications and variations can be made to the method and systems of the present disclosure. Thus it is intended that the present disclosure include modifications and variations that are within the scope of the appended claims and their equivalents.

The invention claimed is:

1. A method of processing a substrate, comprising:
    positioning the substrate in a processing chamber comprising a processing volume, the substrate having at least one feature extending a depth from a substrate surface to a bottom surface, the at least one feature having an inner sidewall surface;
    forming a film comprising a metal on the substrate surface and the inner sidewall surface of the at least one feature, and the bottom surface of the at least one feature, the film having a seam extending substantially parallel to the inner sidewall surface, the seam having a seam width;
    heating the substrate at a temperature of about 300° C. to about 1000° C.;
    exposing the film within the seam to an oxygen radical while converting the metal of the film to a metal oxide, wherein the seam is at least partially filled with the metal oxide; and
    exposing the metal oxide to a hydrogen radical while converting the metal oxide to a metal fill layer.

2. The method of claim 1, wherein the seam is completely filled with the metal oxide.

3. The method of claim 1, wherein exposing the film to the oxygen radical comprises dissociating molecules of an oxygen gas to produce the oxygen radical.

4. The method of claim 3, wherein exposing the film to the oxygen radical comprises flowing the oxygen radical with a first gas selected from the group consisting of $H_2$, Ar, Kr, Xe, $N_2$, He, Ne, and a combination thereof.

5. The method of claim 3,
wherein exposing the film to the oxygen radical comprises flowing the oxygen radical into the processing volume at about 0.1 slm to about 10 slm, and
wherein exposing the metal oxide containing film to the hydrogen radical comprises flowing the hydrogen radical into the processing volume at a rate of about 0.1 slm to about 10 slm.

6. The method of claim 3, wherein dissociating molecules of the oxygen gas occurs within the processing volume.

7. The method of claim 6, wherein the processing volume comprises an excitation source having a radio frequency (RF) at a power of from about 6 kW to about 10 kW.

8. The method of claim 1, wherein exposing the film to the oxygen radical comprises exposing the film to the oxygen radical for about 100 seconds to about 400 seconds,
wherein exposing the metal oxide comprises exposing the metal oxide to the hydrogen radical for about 100 seconds to about 400 seconds.

9. The method of claim 1, wherein the metal of the film comprises Ta, Ti, W, Cr, Co, Al, Cu, Mo, Rb, TaN, TiN, WN, CrN, AlN, RbN, alloys thereof, or combinations thereof.

10. The method of claim 1, wherein exposing the metal oxide to the hydrogen radical comprises flowing the hydrogen radical with a second gas selected from the group consisting of Ar, Kr, Xe, $N_2$, He, Ne, and combinations thereof.

11. The method of claim 1, further comprising exposing the metal fill layer to a nitrogen radical for about 100 seconds to about 400 seconds while converting the metal fill layer to a metal nitride layer, wherein the metal nitride layer is substantially seamless.

12. The method of claim 11, wherein exposing the metal fill layer to the nitrogen radical comprises dissociating molecules of a nitrogen gas into the nitrogen radical.

13. The method of claim 1, wherein the processing volume is maintained at a pressure of about 0.5 Torr to about 5 Torr.

14. A method of processing a substrate, comprising:
positioning the substrate in a first processing chamber comprising a first processing volume, the substrate having at least one feature extending a depth from a substrate surface to a bottom surface, the at least one feature having an inner sidewall surface;
forming a film comprising metal on the substrate surface and the inner sidewall surface, and the bottom surface of the at least one feature, the film having a seam extending substantially parallel to the inner sidewall surface, the seam having a seam width;
positioning the substrate in a second processing chamber comprising a second processing volume;
heating the film at a temperature of about 400° C. to about 650° C.;
exposing the film within the seam to an oxygen radical while converting the metal of the film to a metal oxide, wherein the seam is at least partially filled with the metal oxide;
exposing the metal oxide to a hydrogen radical while converting the metal oxide to a metal fill layer; and
exposing the metal fill layer to a nitrogen radical to convert the metal fill layer to a metal nitride fill layer.

15. The method of claim 14, wherein the seam width of the film before heating and exposing the film is from 2 Å to about 10 Å and the seam width after heating and exposing the film is less than about 2 Å.

16. A system comprising an algorithm stored in a memory of the system, wherein the algorithm comprises a number of instructions which, when executed by a processor, causes the method of claim 14 to be performed.

17. The method of claim 14, wherein the at least one feature has an aspect ratio of greater than or equal to 5:1.

18. The method of claim 14, wherein exposing the film to the oxygen radical comprises flowing the oxygen radical with a first gas selected from the group consisting of $H_2$, Ar, Kr, Xe, $N_2$, He, Ne, and a combination thereof.

19. The method of claim 14, wherein exposing the film to the oxygen radical comprises exposing the film to the oxygen radical for about 100 seconds to about 400 seconds,
wherein exposing the metal oxide comprises exposing the metal oxide to the hydrogen radical for about 100 seconds to about 400 seconds.

20. The method of claim 14, wherein the metal of the film comprises Ta, Ti, W, Cr, Co, Al, Cu, Mo, Rb, alloys thereof, or combinations thereof.

* * * * *